United States Patent
Giraud et al.

(10) Patent No.: US 9,136,366 B2
(45) Date of Patent: Sep. 15, 2015

(54) TRANSISTOR WITH COUPLED GATE AND GROUND PLANE

(71) Applicants: Commissariat a l'energie atomique et aux energies alternatives, Paris (FR); STMicroelectronics SA, Montrouge (FR)

(72) Inventors: Bastien Giraud, Voreppe (FR); Jean-Philippe Noel, Montbonnot Saint Martin (FR); Maud Vinet, Rives sur Fure (FR)

(73) Assignees: Commissariat a l'energie atomique et aux energies alternatives, Paris (FR); STMicroelectronics SA, Mountrouge (FR)

( * ) Notice: Subject to any disclaimer, the term of this patent is extended or adjusted under 35 U.S.C. 154(b) by 0 days.

(21) Appl. No.: 14/156,559

(22) Filed: Jan. 16, 2014

(65) Prior Publication Data
US 2014/0231916 A1    Aug. 21, 2014

(30) Foreign Application Priority Data
Jan. 16, 2013    (FR) ..................... 13 50381

(51) Int. Cl.
| | |
|---|---|
| H01L 29/66 | (2006.01) |
| H01L 29/78 | (2006.01) |
| H01L 29/423 | (2006.01) |
| H01L 29/772 | (2006.01) |
| H01L 29/786 | (2006.01) |

(52) U.S. Cl.
CPC .......... *H01L 29/78* (2013.01); *H01L 29/42392* (2013.01); *H01L 29/66575* (2013.01); *H01L 29/785* (2013.01); *H01L 29/7855* (2013.01); *H01L 29/7856* (2013.01); *H01L 29/78696* (2013.01)

(58) Field of Classification Search
CPC ................. H01L 29/66477; H01L 29/7856; H01L 29/42392; H01L 29/7855; H01L 29/78696; H01L 29/78; H01L 29/772; H01L 29/7812; H01L 29/7824; H01L 21/02038; H01L 21/76264; H01L 21/84
See application file for complete search history.

(56) References Cited

U.S. PATENT DOCUMENTS

| | | |
|---|---|---|
| 2005/0003592 A1 | 1/2005 | Jones |
| 2006/0286724 A1 | 12/2006 | Anderson et al. |

(Continued)

OTHER PUBLICATIONS

Ortiz-Conde and Sanchez "Multi-gate 3-D SOI MOSFETs as the mainstream technology in high speed CMOS applications" Electron Devices for Microwave and Optoelectronic Applications, The 11th IEEE International Symposium on Source (2003).

*Primary Examiner* — Kevin Parendo
(74) *Attorney, Agent, or Firm* — Occhiuti & Rohlicek LLP

(57) ABSTRACT

An integrated circuit includes a silicon substrate, a ground plane above the substrate, a buried insulator layer above the ground plane, a silicon layer above the buried insulator layer and separated from the ground plane by the buried insulator layer, and an FDSOI transistor. The transistor has a channel adapted for being formed in the silicon layer, a source and drain in and/or on the silicon layer, and a gate covering an upper face of the channel and having a lateral portion covering a lateral face of the channel and above the ground plane. A distance between the lateral portion and the ground plane is not more than three nanometers and at least five times less than a thickness of the buried insulator layer between the ground plane and the silicon layer. The ground plane is separated from the gate by the buried insulator layer.

11 Claims, 8 Drawing Sheets

(56) References Cited

U.S. PATENT DOCUMENTS

| | | |
|---|---|---|
| 2007/0008013 A1 | 1/2007 | Fijany et al. |
| 2012/0104495 A1* | 5/2012 | Zhu et al. .................. 257/347 |
| 2012/0299098 A1 | 11/2012 | Liu |
| 2013/0049140 A1* | 2/2013 | Asenov et al. ............... 257/411 |
| 2013/0119470 A1* | 5/2013 | Horita et al. ................. 257/347 |
| 2013/0146953 A1* | 6/2013 | Cheng et al. ................. 257/296 |
| 2014/0003135 A1* | 1/2014 | Asthana et al. .............. 365/156 |

\* cited by examiner

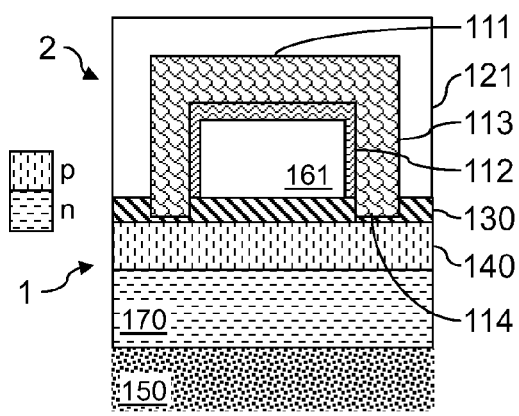
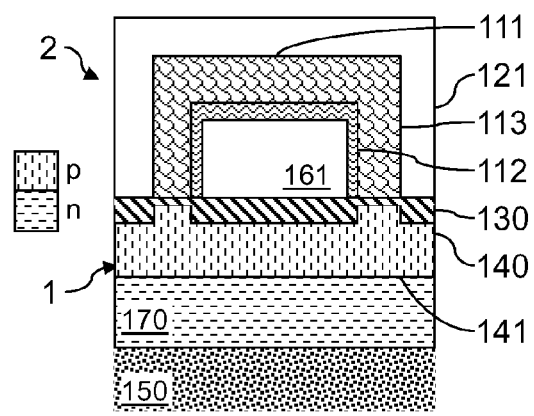
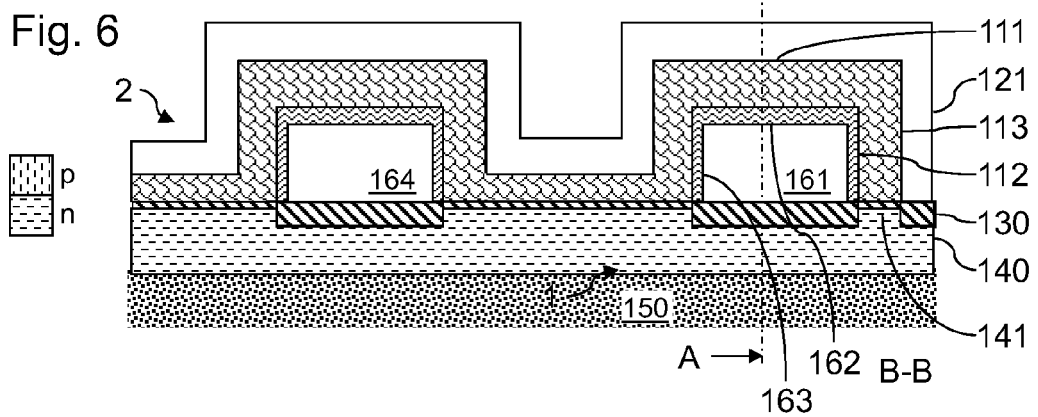

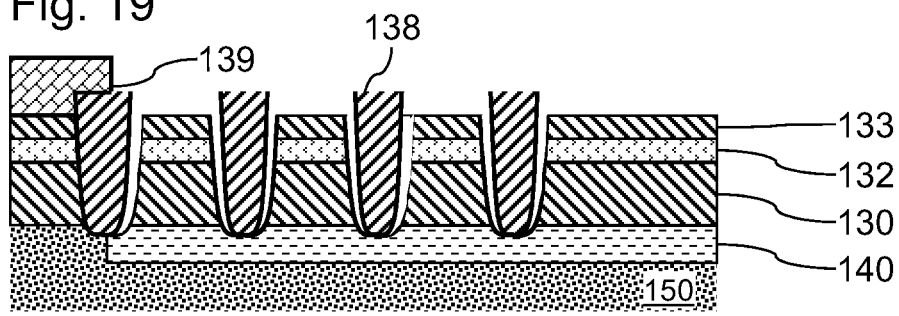
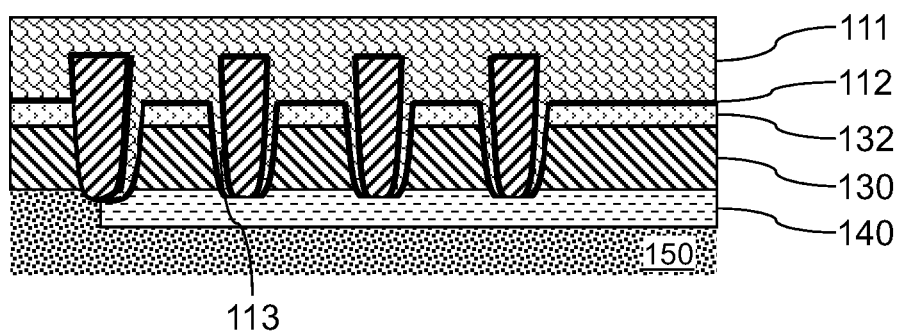
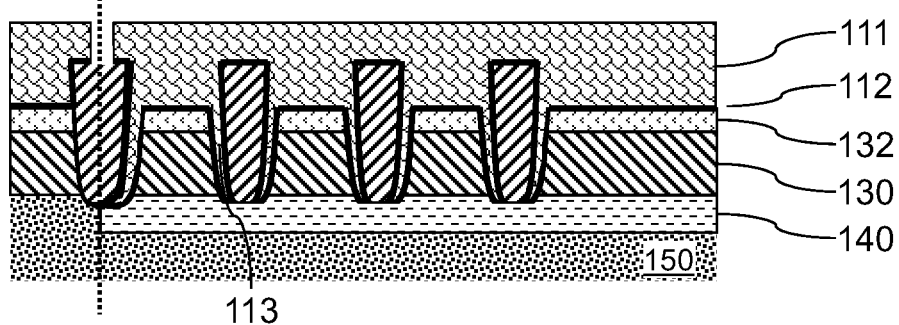
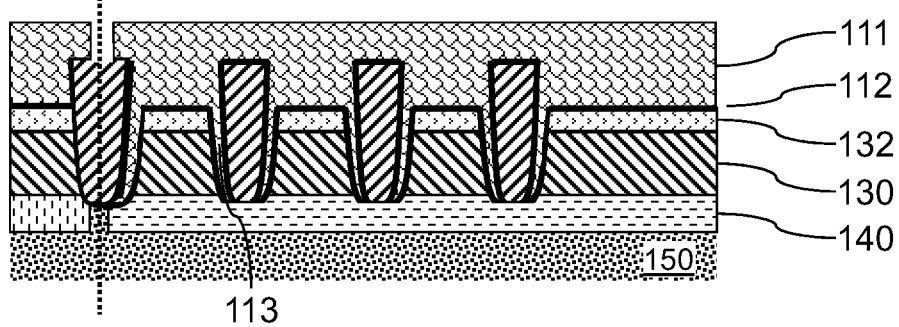

TRANSISTOR WITH COUPLED GATE AND GROUND PLANE

RELATED APPLICATIONS

This application claims the benefit of the priority of French application FR1350381, filed on Jan. 16, 2013, the contents of which are herein incorporated by reference.

FIELD OF INVENTION

The invention relates to integrated circuits, and in particular integrated circuits produced on a substrate of silicon on insulator (SOI) type.

BACKGROUND

SOI technology consists in separating a fine silicon layer (a few nanometers) on a silicon substrate by a relatively thick insulator layer (a few tens of nanometers, as a general rule).

Integrated circuits produced with SOI technology exhibit certain advantages. Such circuits generally exhibit lower electrical consumption for equivalent performance. Such circuits also induce lower parasitic capacitances, which make it possible to improve switching speed. Moreover, the phenomenon of parasitic triggering (known as "latchup") encountered by Bulk-technology MOS transistors can be avoided. Such circuits therefore turn out to be particularly suitable for applications of SoC or MEMS type. It is also noted that SOI integrated circuits are less sensitive to the effects of ionizing radiations and thus turn out to be more reliable in applications where such radiations may induce operating problems, in particular in space applications. SOI integrated circuits may in particular comprise random-access memories of SRAM type or logic gates.

The reduction in the static consumption of logic gates while increasing their tripping speed forms the subject of much research. Certain integrated circuits under development integrate logic gates with low consumption and also logic gates with high tripping speed. To generate these two types of logic gates on one and the same integrated circuit, the threshold voltage of certain transistors of the logic gates with fast access is lowered, and the threshold voltage of other transistors of the logic gates with low consumption is increased. In Bulk technology, the modulation of the threshold voltage level of transistors of the same type is performed by differentiating their channel doping level. However, in FDSOI (for Fully Depleted Silicon On Insulator) technology, the doping of the channel is almost zero ($10^{15}$ cm$^{-3}$). Thus, the doping level of the channel of the transistors therefore cannot exhibit significant variations, thus preventing differentiation of the threshold voltages in this manner. A solution proposed in certain studies for producing transistors of the same type with distinct threshold voltages is to integrate various gate materials for these transistors. However, the practical production of such an integrated circuit turns out to be technically tricky and economically prohibitive.

In order to have distinct threshold voltages for various transistors in FDSOI technology, it is also known to use a back gate or a biased ground plane disposed between a thin insulating oxide layer (TBOX or UTBOX) and the silicon substrate. By altering the doping of the ground planes and their bias, it is possible to define a range of threshold voltages for the various transistors. It will thus be possible to have low-threshold-voltage transistors termed LVT (for "Low Vt", typically 400 mV), high-threshold-voltage transistors termed HVT (for "High Vt", typically 550 mV) and medium-threshold-voltage transistors termed SVT (for "Standard Vt", typically 450 mV).

Various designs have been developed in order to optimize the electrostatic control of the channel of such transistors (quantified in particular by the values DIBL (for drain-induced barrier lowering) and without SS (for subthreshold swing)).

According to a first design entitled 3DFDSOI, the channel exhibits a width that is greater than its thickness (dimension according to the perpendicular to the insulating oxide layer) and the gate envelops the lateral faces and also the upper face of the channel.

According to a second design known by the term "Tri Gate," the channel exhibits a width that is roughly equivalent to its thickness and the gate envelops the lateral faces and also the upper face of the channel. Overall it is considered that the number of gates acting on the channel is multiplied.

According to a third design known by the term "FinFET," the channel exhibits a width that is less than its thickness and the gate envelops the lateral faces and also the upper face of the channel.

The general aim of these designs is to maximize the coverage of the channel by the gate. Among these designs, it is generally considered that the higher the ratio of the thickness to the width of the channel:

the more a high electrostatic control of the channel is obtained;

the more complex the method of fabrication of the transistor;

the more the method of fabrication of the transistor comprises dispersions in the channel width and in the threshold voltage; and the less the threshold voltage of the transistor can be adapted by biasing its back gate.

Thus, with a design of the FinFET type, it turns out to be particularly tricky to produce integrated circuits comprising transistors having different threshold voltages or dynamically configurable threshold voltages. It is in particular tricky to compensate the dispersions of the threshold voltage by biasing the back gate.

SUMMARY

In one aspect, the invention features a manufacture including an integrated circuit that includes a silicon substrate, a ground plane above the substrate, a buried insulator layer above the ground plane, a silicon layer above the buried insulator layer and separated from the ground plane by the buried insulator layer, and an FDSOI transistor. The transistor has a channel adapted for being formed in the silicon layer, a source and drain in and/or on the silicon layer, and a gate covering an upper face of the channel and having a lateral portion covering a lateral face of the channel and above the ground plane. A distance between the lateral portion and the ground plane is not more than three nanometers and at least five times less than a thickness of the buried insulator layer between the ground plane and the silicon layer. The ground plane is separated from the gate by the buried insulator layer.

In some embodiments, the ground plane is adapted for being in electrical contact with the gate.

In other embodiments, the lateral portion of the gate extends in the thickness of the buried insulator layer.

In yet other embodiments, the ground plane extends in the thickness of the buried insulator layer below the lateral portion of the gate.

Also included are embodiments in which a ratio of the width of the channel to the thickness of the channel lies between 0.75 and 2.5.

Among the embodiments are those in which the transistor is adapted for including an other channel extending between the source and the drain, the gate covering an upper face of the other channel and including an other lateral portion covering a lateral face of the other channel and disposed above the ground plane, a distance between the other lateral portion and the ground plane being less than a thickness of the buried insulator layer between the ground plane and the silicon layer.

In another aspect, the invention features a method of fabricating an integrated circuit, the method including providing an element including a silicon substrate, a ground plane disposed above the substrate, a buried insulator layer disposed above the ground plane, and a silicon layer disposed above the buried insulator layer and separated from the ground plane by the buried insulator layer, forming a channel of an FDSOI transistor in the silicon layer, forming a source and a drain of the FDSOI transistor in and/or on the silicon layer, and forming a gate of the FDSOI transistor covering an upper face of the channel and including a lateral portion covering a lateral face of the channel and disposed above the ground plane, the ground plane being separated from the gate by the buried insulator layer, a distance between the lateral portion and the ground plane being less than or equal to three nanometers and at least five times less than a thickness of the buried insulator layer between the ground plane and the silicon layer.

In some practices of the invention, formation of the gate comprises formation of an electrical contact between the gate and the ground plane.

Other practices of the invention further include separating the gate from the ground plane by the buried insulator layer.

Yet other practices of the invention include extending a lateral portion of the gate into the thickness of the buried insulator layer.

Also among the practices of the invention are those that further include a step of epitaxy so as to form a part of the ground plane extending in the thickness of the buried insulator layer below the lateral portion of the gate.

DESCRIPTION OF THE FIGURES

Other characteristics and advantages of the invention will emerge clearly from the description below which is given hereinafter, by way of wholly nonlimiting indication, with reference to the appended drawings, in which:

FIGS. 4 and 5 are transverse sectional views through the width of the channel of the transistor, for third and fourth variants of a first embodiment of the invention;

FIG. 6 is a transverse sectional view through the width of the channel of transistors, for an alternative of the second variant of the first embodiment;

FIGS. 11 to 21 are sectional views illustrating various steps of an example of method of fabrication of an integrated circuit according to the invention;

FIG. 22 illustrates a variant of an integrated circuit at the same stage of the method of fabrication as FIG. 21.

DETAILED DESCRIPTION

The invention proposes to increase the coupling between the gate and the channel of an FDSOI transistor by covering, on the one hand, a lateral face and an upper face of the channel with this gate, and by disposing, on the other hand, at least one part of the gate at a distance from a ground plane that is less than the thickness of a buried insulator layer separating this ground plane from the channel.

Figure 1:
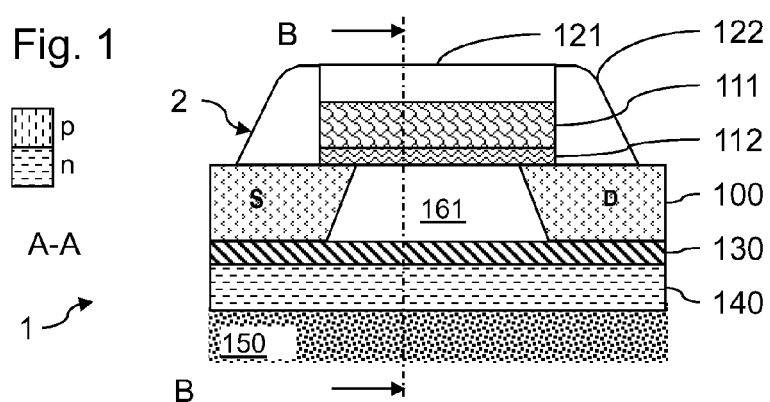
FIG. 1 is a transverse sectional view of an integrated circuit furnished with an FDSOI transistor according to the invention, through the length of its channel.

FIG. 1 is a transverse sectional view of an integrated circuit 1 furnished with an FDSOI transistor 2 according to the invention. The transverse section illustrated is effected here through the length of the channel 161 of the transistor 2.

The integrated circuit 1 comprises a silicon substrate 150, which in this example exhibits P type doping. A ground plane 140 (often designated by the terms "back plane" or "back gate") is made above the substrate 150. A buried electrical insulator layer 130 separates the ground plane 140 from the transistor 2. The buried insulator layer 130 is, for example, made of silicon oxide. The layer 130 is thus surmounted by an active silicon layer 100 in which the source S, the channel 161 and the drain D of the transistor 2 are made. The channel 161 is therefore, in particular, separated from the ground plane 140 by the buried insulator layer 130.

The channel 161 is covered by a gate oxide layer 112. The gate oxide layer 112 is surmounted by a gate stack comprising a metallic gate 111 and a polysilicon layer 121. The gate stack 112 is delimited laterally by spacers 122. Insulation trenches (not illustrated) are placed around the transistor 2 between the surface of the layer 100 and as far as the ground plane 140.

In order to allow modulation of the threshold voltage of the transistor 2 by altering the bias and the doping of the ground plane 140, the buried insulator layer 130 is of the UTBOX type, this type of layer typically exhibiting a thickness less than or equal to 50 nm, preferably less than or equal to 20 nm, or indeed less than or equal to 10 nm.

The ground plane 140 makes it possible to improve the electrostatic control of the channel of the transistor by limiting the penetration of the electric fields generated by the drain and the source under the channel 161. The reduction in the lateral electrostatic coupling reduces the short channel effects and limits the depletion effect by the drain DIBL.

The following dopings may for example be used:
NGP (doping of the ground plane $140$)=$10^{18}$ cm$^{-3}$
NS (doping of the substrate layer $150$)=$3*10^{15}$ cm$^{-3}$
NC (doping of the channel $161$)=$3*10^{15}$ cm$^{-3}$ According to the invention, at least one part of the gate 111 is at a distance from the ground plane 140 of less than the thickness of the buried insulator layer 130 separating this ground plane 140 from the channel 161. In the different variants detailed subsequently, the gate 111 covers the upper face 162 of the channel 161 and comprises at least one lateral portion 113 covering a lateral face 163 of the channel. This portion 113 is disposed above the ground plane 140.

Figure 2:
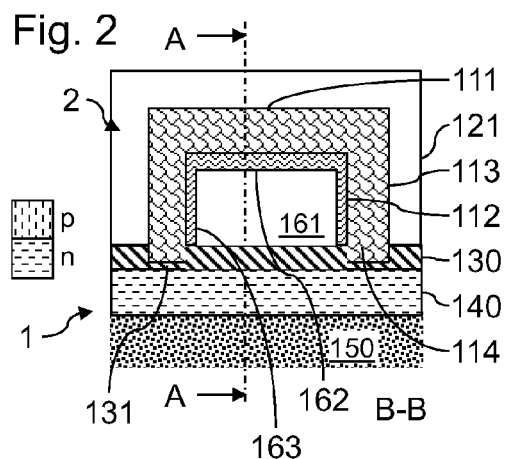
FIGS. 2 and 3 are transverse sectional views through the width of the channel of the transistor, for first and second variants of a first embodiment of the invention.
Figure 3:
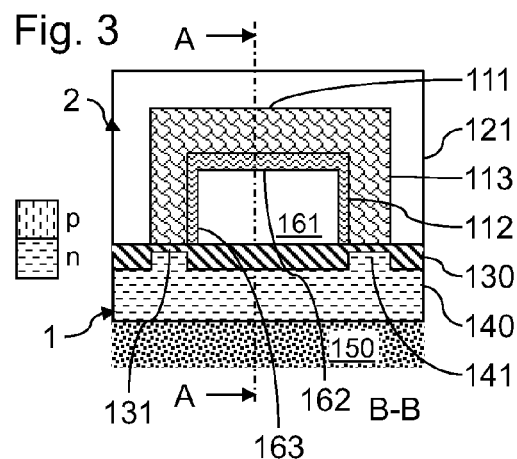

FIGS. 2 and 3 are schematic transverse sectional views of first and second variants according to a first embodiment. The transverse sections illustrated are made in the width of the channel of the transistor 2. In the variants of FIGS. 2 and 3, the gate 111 comprises two lateral portions 113 extending on either side of the channel 161 to cover two lateral faces 163 of the channel 161.

In this first embodiment, the ground plane 140 is electrically insulated from the gate 111 by way of the buried insulator layer 130. The thickness of the buried insulator layer 130 between the ground plane 140 and the lateral portions 113 (illustrated by the zone 131) is here at least 5 times less than the thickness of the buried insulator layer 130 between the channel 161 and the ground plane 140. The ground plane 140 then exhibits excellent electrostatic coupling with the gate 111 thereby favoring the electrostatic control of the channel 161. The thickness of the layer 130 between the lateral portions 113 and the ground plane 140 is advantageously at least five times less, or indeed at least ten times less than the thickness of the layer 130 between the channel 161 and the ground plane 140. The thickness of the layer 130 between the lateral portions 113 and the ground plane 140 is less than or equal to 3 nm, preferably less than or equal to 2 nm, and may even be equal to 1 nm.

On account of the electrical insulation between the gate 111 and the ground plane 140, it is possible to apply an independent bias to the ground plane 140 so as to allow control of the value of the threshold voltage of the transistor 2. Furthermore, the volume of semiconductor to be biased upon the application of a voltage to the gate 111 is relatively restricted, thereby making it possible to obtain faster switching of the transistor 2.

In the variant of FIG. 2, the lateral portion 113 of the gate 111 extends in the thickness of the buried insulator layer 130. The lateral portion 113 of the gate comprises a projection 114 that extends across the buried insulator layer 130. The projections 114 may, for example, be formed by a localized hollowing out of the layer 130 before depositing the material of the gate 111. In the variant of FIG. 3, the ground plane 140 extends in the thickness of the buried insulator layer 130. The ground plane 140 thus comprises vertical projections 141 that extend in the buried insulator layer 130. The vertical projections 141 may, for example, be formed during epitaxy pickup steps of the fabrication method.

Although the ground plane 140 exhibits a doping of type N in the examples of FIGS. 1 to 3, the ground plane 140 can, of course, also exhibit a doping of type P, in order to modify the value of the threshold voltage of the transistor 2. Although the ground plane 140 is made directly on the substrate 150 in the examples of FIGS. 1 to 3, the ground plane 140 can of course also be separated from substrate 150 by way of a deeply buried well.

FIGS. 4 and 5 are schematic transverse sectional views of third and fourth variants of the integrated circuit 1 according to the first embodiment. The transverse sections illustrated are made through the width of the channel of the transistor 2. In the variants of FIGS. 4 and 5, the gate 111 comprises two lateral portions 113 extending on either side of the channel 161, to cover two lateral faces 163 of the channel 161.

In these variants, the ground plane 140 comprises a P type doping. In these variants, the ground plane 140 is separated from the substrate 150 by way of a deeply buried well 170, exhibiting in this instance N type doping In the variant of FIG. 4, the lateral portion 113 of the gate 111 extends in the thickness of the buried insulator layer 130 and comprises a projection 114 that extends in the buried insulator layer 130.

In the variant of FIG. 5, the ground plane 140 extends in the thickness of the buried insulator layer 130 and thus comprises vertical projections 141 that extend into the buried insulator layer 130.

In order to favor the influence of the lateral portions 113 on the electrostatic control of the channel 161, the ratio of the width of the channel 161 to its thickness is advantageously less than or equal to 2.5. In order to favor the influence of the ground plane 140 on the threshold voltage of the transistor 2 and to facilitate its fabrication process, the ratio of the width of the channel 161 to its thickness is advantageously at least equal to 0.75.

In order to facilitate the fabrication of transistors whose gate width is greater than that of the track pitch, it is advantageously possible to produce several channels extending between the source and the drain of a transistor. Each channel then exhibits a width of less than the track pitch, the channel width of the transistor then being obtained through the number of channels that it comprises. The distance Dc between two parallel channels may, for example, be obtained through the following formula: Dc=2*Epox+Eming, with Epox the thickness of the gate oxide, and Eming the minimum thickness of the gate metal. A usual value for Epox and Eming is 3 nm. The minimum track pitch for the production method can be defined as the sum of the channel width (typically lying between 10 and 15 nm) and of the distance Dc.

FIG. 6 is a transverse sectional view of a transistor 2 corresponding to an alternative of the second variant of the first embodiment. Here, the transistor 2 comprises at least the first channel 161 and a second channel 164. Here, the gate 111 and its lateral portions 113 cover the upper faces and the lateral faces of the channels 161 and 164. This alternative makes it possible to adapt the channel width to a desired value, with reduced dispersions and with ease of design. An appropriate number of parallel channels may, for example, be defined for a given channel width.

The formation of the gate 111 can comprise one and the same step of metallic deposition for the integrated circuit 1 as a whole. Likewise, the formation of the gate oxide layer 112 can be carried out during one and the same phase for the integrated circuit 1 as a whole.

Figure 7:
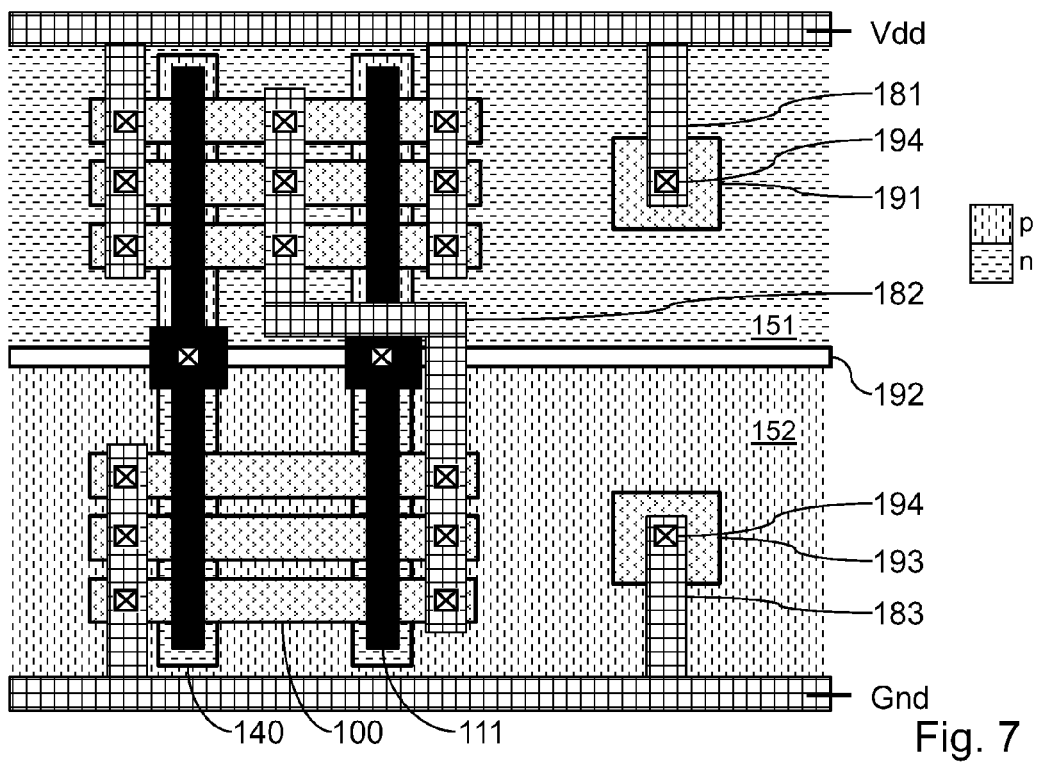
FIG. 7 is a schematic top view of an example of a logic gate formed in an integrated circuit according to the invention.

FIG. 7 is a top view of an example of topography of an NAND gate NAND2 formed in an example of integrated circuit 1 according to the invention. Depicted therein are two pMOS transistors in the upper part and two nMOS transistors in the lower part. A deep isolation trench 192 separates the pMOS transistors and the nMOS transistors. A metallic power supply line 181 connects the sources of the pMOS transistors to a voltage Vdd. The metallic power supply line 181 also biases an N-doped well 151 by way of a semi-conducting pad 191 and of a contact 194. A metallic power supply line 183 connects the source of an nMOS transistor to a voltage ground, Gnd. The metallic power supply line 183 also biases a P-doped well 152 by way of a semi-conducting pad 193 and of a contact 194. The source of the other nMOS transistor is connected to the drain of the pMOS transistors by way of a metallic connection 182. Each pMOS transistor and each nMOS transistor here comprises three parallel channels so as to exhibit an appropriate channel width. A common gate 111 overhangs the channels of the left nMOS transistor and the left pMOS transistor. Another common gate 111 overhangs the channels of the right nMOS transistor and the right pMOS transistor.

As illustrated, the etching of the layer 130 is wider here than the gate 111. This makes it possible advantageously to reduce the cost of the etching mask for the layer 130.

Figure 8:
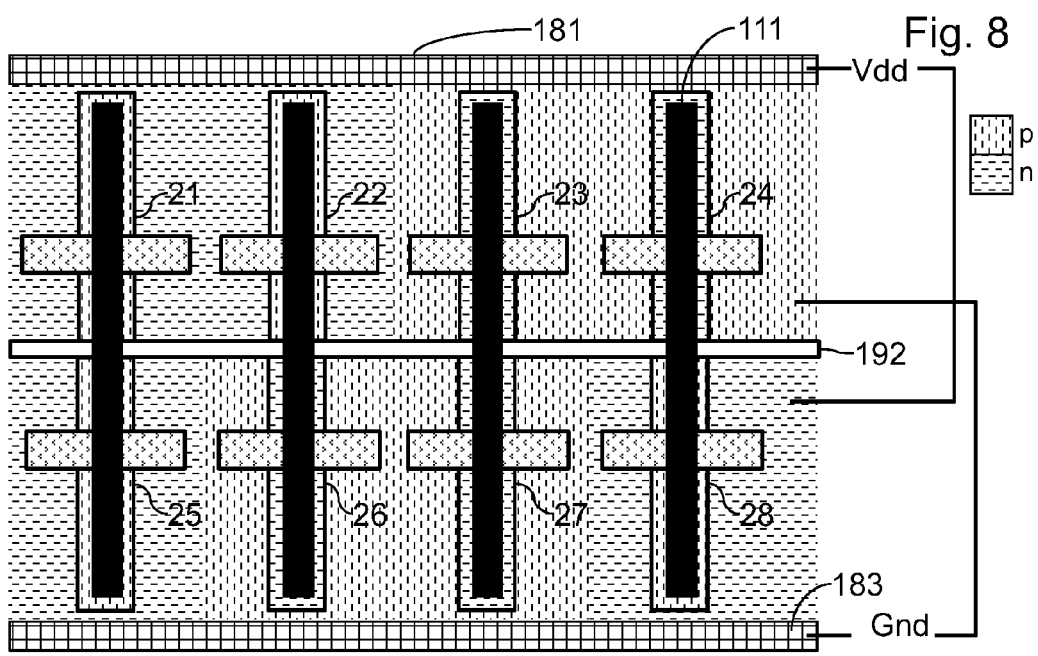
FIG. 8 is a top view illustrating a first example of cointegration of various transistors.

FIG. 8 is a top view illustrating a first example of co-integration of transistors exhibiting various threshold voltages. The integrated circuit comprises a row of nMOS transistors 21 to 24 and a row of pMOS transistors 25 to 28. The transistors 23, 24, 26 and 27 are made above wells with doping of type P, and above ground planes with doping of type N. These wells with doping of type P are biased to Gnd. The transistors 21, 22, 25 and 28 are made above wells with doping of type N, and above ground plane with doping of type P. These wells with doping of type N are biased to Vdd. Thus, all the ground planes are made on wells exhibiting a doping of opposite type. With the biases exhibited, the diodes formed at the junctions between ground planes and wells are systematically reverse-biased, thus avoiding any short-circuit. An isolation trench 192 separates the row of nMOS transistors from the row of pMOS transistors.

With the biases and dopings mentioned, the transistors 21, 22, 26 and 27 are of the LVT type, the transistors 25 and 28 are of the RVT type and the transistors 23 and 24 are of the HVT type. The configuration illustrated in FIG. 8 thus corresponds to a cointegration of transistors exhibiting various threshold voltage levels.

Figure 9:
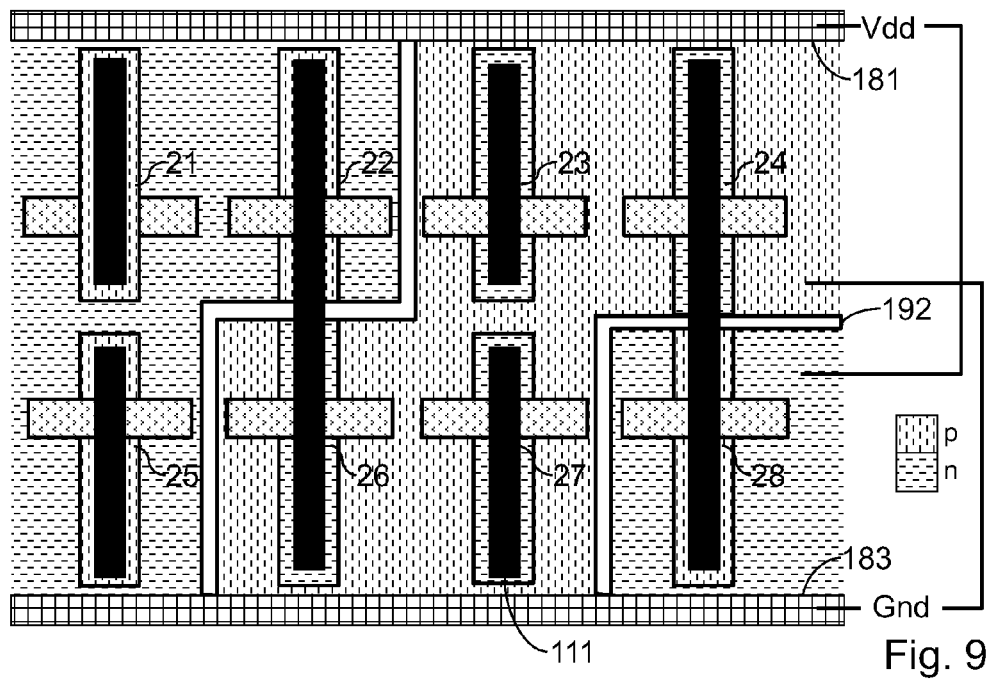
FIG. 9 is a top view illustrating a second example of cointegration of various transistors.

FIG. 9 is a top view illustrating a second example of cointegration of transistors exhibiting various threshold voltages. The integrated circuit comprises a row of nMOS transistors 21 to 24 and a row of pMOS transistors 25 to 28.

The transistors 23, 24, 26 and 27 are made above wells with doping of type P, and above ground planes with doping of type N. These wells with doping of type P are biased to Gnd. The transistors 21, 22, 25 and 28 are made above wells with doping of type N, and above ground planes with doping of type P. These wells with doping of type N are biased to Vdd. Thus, all the ground planes are made on wells exhibiting a doping of opposite type. With the biases exhibited, the diodes formed at the junctions between ground planes and wells are systematically reverse-biased, thus avoiding any short-circuit. Here the isolation trenches 192 make it possible to avoid contact between wells and ground planes exhibiting one and the same type of doping.

Figure 10:
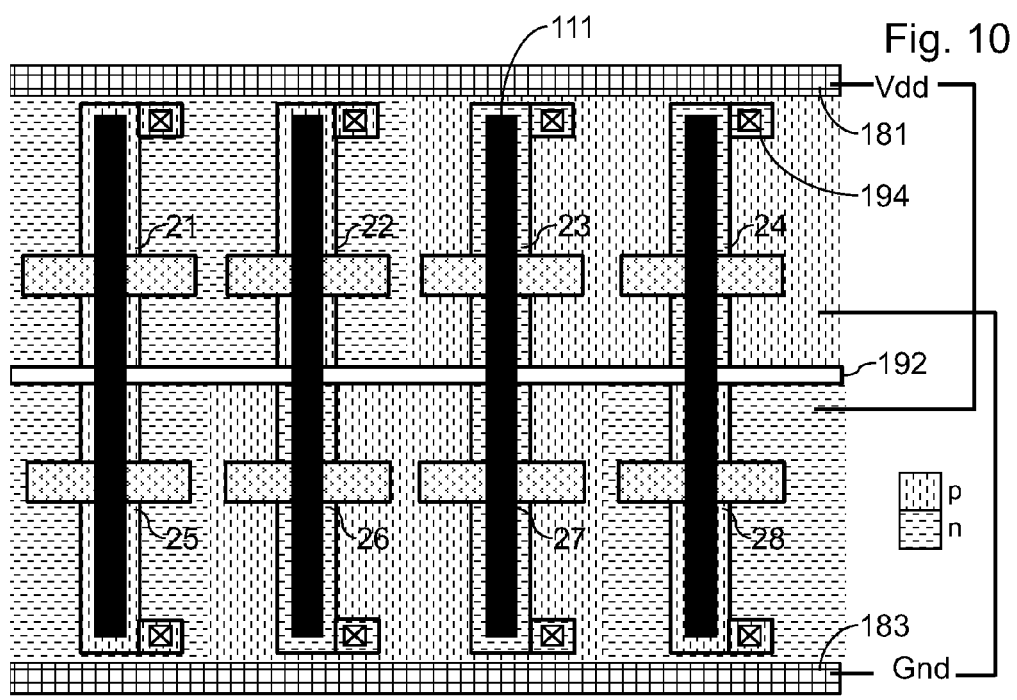
FIG. 10 is a top view illustrating a third example of cointegration of various transistors.

FIG. 10 is a top view illustrating a third example of cointegration of transistors exhibiting various threshold voltages. These transistors correspond to the first embodiment of the invention, the various ground planes here being biased by way of contacts 194.

FIGS. 11 to 22 are sectional views illustrating various steps of an example of a method of fabrication of an integrated circuit according to the invention.

Figure 11:
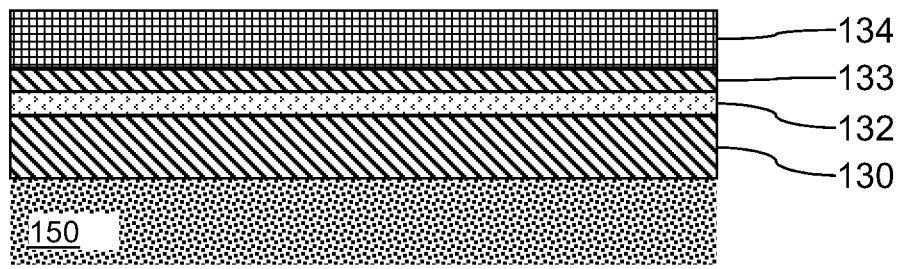

As illustrated in FIG. 11, an extremely thin silicon layer 132 is deposited on the buried insulator layer 130, a silicon oxide buffer layer 133 is deposited on the layer 132, and a silicon nitride layer 134 is deposited on the layer 133.

Figure 12:
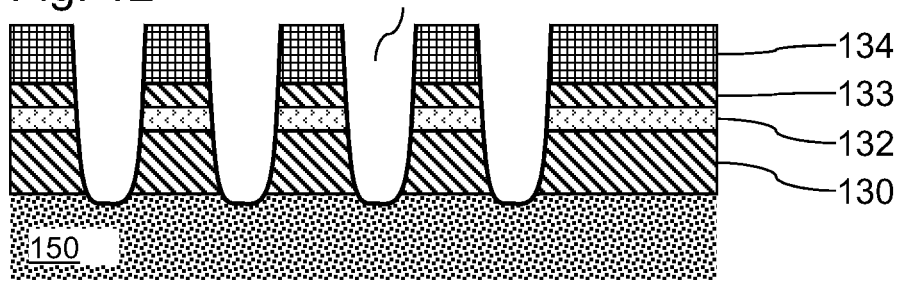

In FIG. 12, the active zones have been defined by lithography and etching. Grooves 135 are thus formed as far as the silicon substrate 150. Ideally, the etching is carried out only as far as the interface between the substrate 150 and the layer 130. However, the grooves 135 may advantageously extend in the silicon substrate 150 to a depth of between zero and 40 nm.

Figure 13:
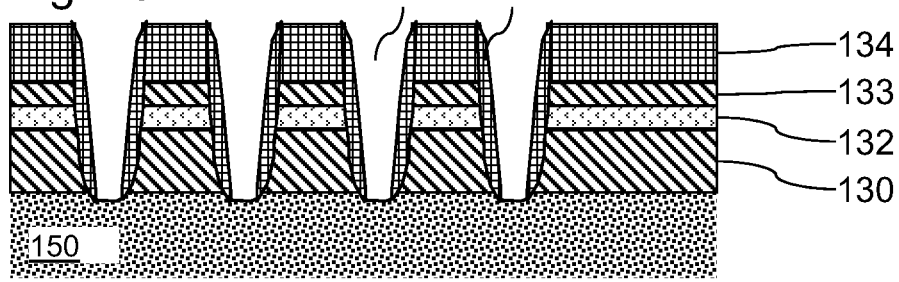

In FIG. 13, spacers 136 have been produced inside the grooves 135, by deposition of a silicon nitride film. The silicon nitride of the spacers 136 may be deposited with the suitable equipment, such as that distributed under the commercial reference iRAD by the company Tokyo Electron Limited, so as to be able to exhibit selectivity of etching with respect to the silicon nitride layer 134. The spacers 136 will thus have to be etched more quickly than the layer 134 during chemical attack with glycol HF. The spacers 136 may for example be formed with a thickness of between 5 and 20 nm. For a groove 135 whose width is less than twice the thickness of a spacer, the groove 135 will be completely filled by the silicon nitride. Advantageously, the thickness of a spacer 136 will be at least twice the thickness of the gate oxide.

Figure 14:
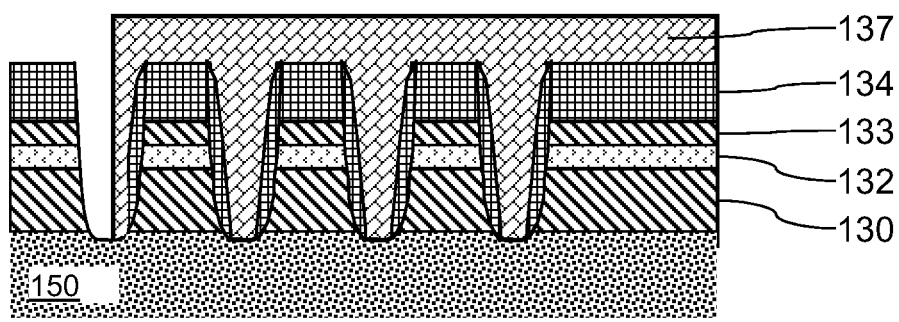

In FIG. 14, a part of the circuit has been masked and an isotropic etching (for example with a mixture HFEG or $H_3PO_4$ with a solution pH>3) of the spacers 136 in the unmasked zones has been carried out. This step makes it possible to cointegrate a zone comprising transistors according to the invention under the resin mask 137, and another zone exhibiting transistors according to the art. It is also possible to envisage circumventing an etching with resin by using a fine oxide layer as hard mask, and then etching this fine layer by BOE (for Buffered Oxide Etch) with a pH>3, so as thereafter to play the role of resin without limitation of pH value.

Figure 15:
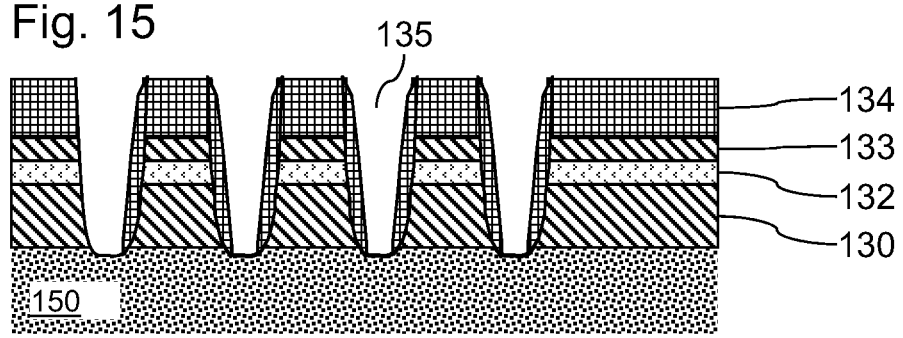

In FIG. 15, the removal of the etching mask 137 has been undertaken so as to reveal the spacers 136.

Figure 16:
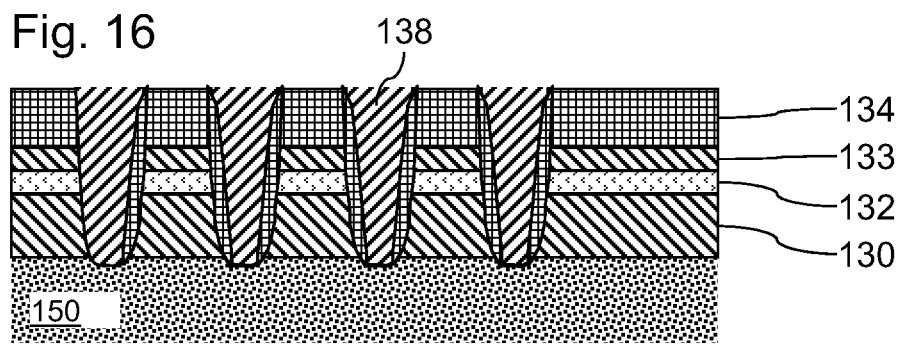

In FIG. 16, the filling of the grooves 135 with silicon oxide 138 and a mechanochemical planarization has been undertaken. These steps are well known to the person skilled in the art for producing isolation trenches of STI type.

Figure 17:
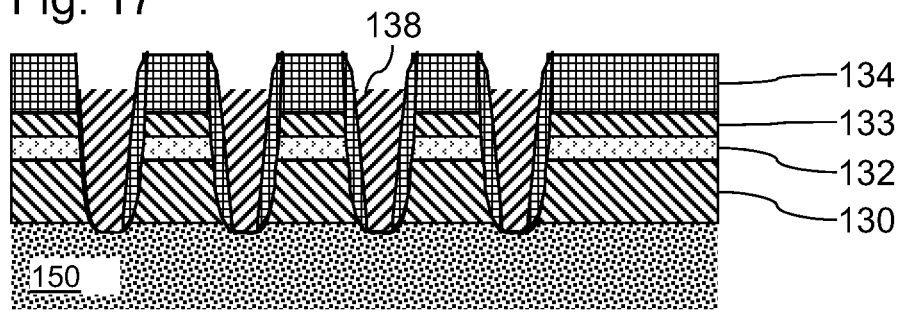

In FIG. 17, a chemical etching of the silicon oxide 138 to a desired depth has been undertaken.

Figure 18:
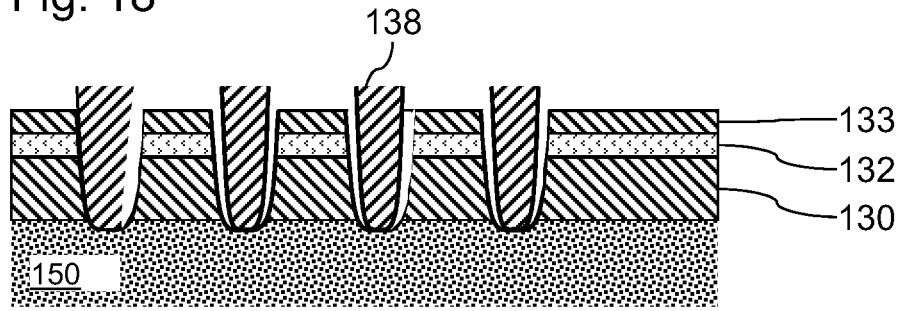

In FIG. 18, the removal of the spacers 136 and of the silicon nitride layer 134 has been undertaken, for example by attack with orthophosphoric acid $H_3PO_4$.

In FIG. 19, the deposition of an etching mask 139 has been undertaken, this mask 139 revealing the zone intended to receive the transistors according to the invention. A ground plane 140 is implanted in the substrate 150, in the zone revealed by the mask 139. A deeper implantation of the ground plane 140 in the zones above the previously removed spacers 136 may be noted. This implantation difference is relatively limited when the thickness of the spacers 136 lies between 5 and 20 nm.

In FIG. 20, the silicon oxide buffer layer 133 has been removed. A gate oxide film 112 is deposited until contact with the ground plane 140 (this corresponding to the first variant of the first embodiment, the gate oxide 112 ensuring separation between ground plane 140 and gate 111). The metallic gate 111 is deposited on the gate oxide 112. The metallic gate 111 thus extends depth-wise in the form of salient lateral portions 113 in the zone previously occupied by the spacers 136. The metallic gate 111 thus covers lateral faces of portions of the layer 130. Channels are thus formed in the silicon layer 132.

In FIG. 21, the gate 111 has been etched to form a separation (marked out by the dotted line) between a gate for a transistor according to the prior art, and a transistor according to the invention, exhibiting in particular a multiplicity of channels.

On account of the silicon oxide fillings 138 between the salient portions 114 of the gate, the volume of the lateral portions 113 covering the lateral faces of the insulating layer 130 is relatively limited.

According to the method of fabrication described hereinabove, the silicon oxide filling 138 can be used as an isolation trench between transistors according to the invention and transistors according to the prior art, as is illustrated in FIG. 21. Transistors according to the invention can, of course, also be produced without making fillings 138 of silicon oxide between two lateral portions 113 of a gate 111.

FIG. 22 illustrates a variant of the integrated circuit at the same stage of the fabrication process as in FIG. 21. In this variant, the transistor placed on the left of the dotted line is also produced according to the prior art but comprises a ground plane with P-type doping.

Figure 23:
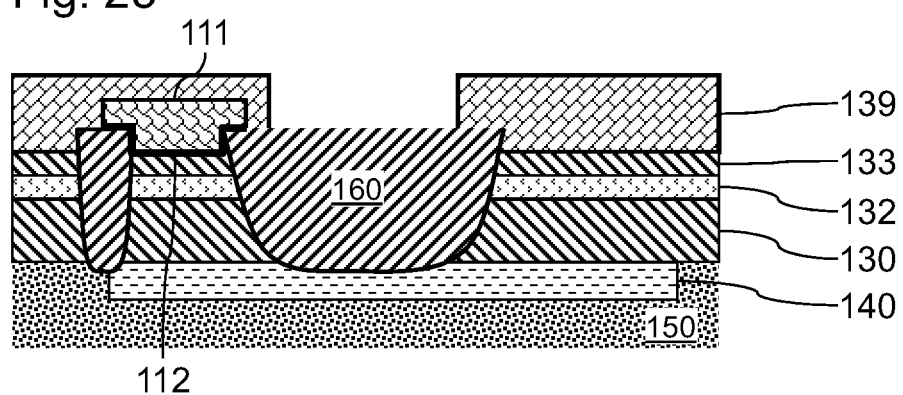
FIGS. 23 and 24 are sectional views illustrating method steps for the production of a configuration such as illustrated in FIG. 10.
Figure 24:
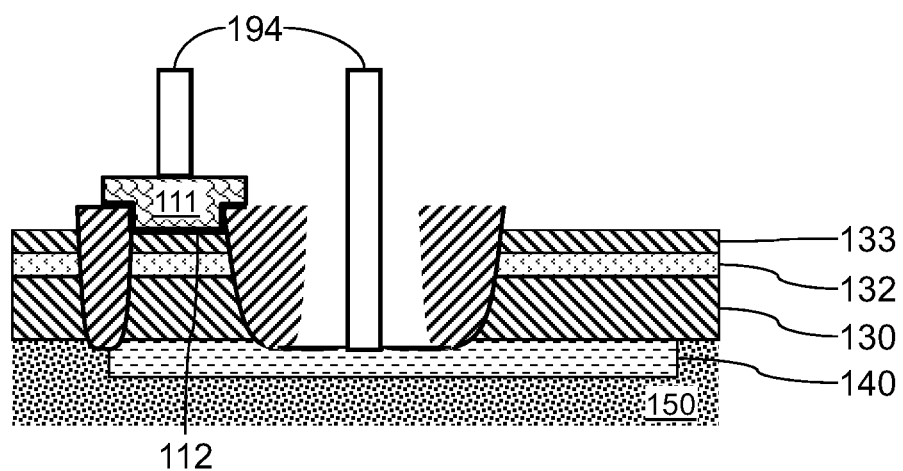

FIGS. 23 and 24 illustrate sectional views of an integrated circuit of a configuration according to FIG. 10 during two steps of its method of fabrication. The gate 111 is formed on the silicon oxide layer 112, above the channel of a transistor.

A silicon oxide pad 160 of STI type is also formed above the ground plane 140 of the transistor. As illustrated in FIG. 23, an etching mask 139 covers the integrated circuit while revealing the middle part of the silicon oxide pad 160.

In FIG. 24, the middle part of the pad 160 has been etched and the etching mask 139 has been removed. Metallic contacts 194 are formed here. A contact 194 is in electrical contact with the gate 111, and a contact 194 is in electrical contact with the ground plane 140.

Having described the invention, and a preferred embodiment thereof, what is claimed as new and secured by Letters Patent is:

1. A manufacture comprising an integrated circuit, said integrated circuit comprising a silicon substrate, a ground plane disposed above said silicon substrate, a buried insulator layer disposed above said ground plane, a silicon layer disposed above said buried insulator layer and separated from said ground plane by said buried insulator layer, and an FDSOI transistor having a channel adapted for being formed in said silicon layer, a source and drain disposed in and/or on said silicon layer, and a gate that covers an upper face of said channel and that comprises a lateral portion covering a lateral face of said channel and disposed above said ground plane, wherein a distance between said lateral portion and said ground plane is greater than zero but less than or equal to three nanometers and is at least five times less than a thickness of said buried insulator layer between said ground plane and said silicon layer, and wherein said ground plane is separated from said gate by said buried insulator layer.

2. The manufacture of claim 1, wherein said ground plane is adapted for being in electrical contact with said gate.

3. The manufacture of claim 1, wherein said lateral portion of said gate extends in said thickness of said buried insulator layer.

4. The manufacture of claim 1, wherein said ground plane extends in said thickness of said buried insulator layer below said lateral portion of said gate.

5. The manufacture of claim 1, wherein a ratio of a width of said channel to a thickness of said channel lies between 0.75 and 2.5.

6. The manufacture of claim 1, wherein said transistor is adapted for comprising an other channel extending between said source and said drain, said gate covering an upper face of said other channel and comprising an other lateral portion covering a lateral face of said other channel and disposed above said ground plane, a distance between said other lateral portion and said ground plane being less than a thickness of said buried insulator layer between said ground plane and said silicon layer.

7. A method of fabricating an integrated circuit, said method comprising providing an element comprising a silicon substrate, a ground plane disposed above said substrate, a buried insulator layer disposed above said ground plane, and a silicon layer disposed above said buried insulator layer and separated from said ground plane by said buried insulator layer, forming a channel of an FDSOI transistor in said silicon layer, forming a source and a drain of said FDSOI transistor in and/or on said silicon layer, and forming a gate of said FDSOI transistor covering an upper face of said channel and comprising a lateral portion covering a lateral face of said channel and disposed above said ground plane, said ground plane being separated from said gate by said buried insulator layer, wherein a distance between said lateral portion and said ground plane is greater than zero but less than or equal to three nanometers and at least five times less than a thickness of said buried insulator layer between said ground plane and said silicon layer.

8. The method of claim 7, wherein formation of said gate comprises formation of an electrical contact between said gate and said ground plane.

9. The method of claim 7, further comprising separating said gate from said ground plane by said buried insulator layer.

10. The method of claim 7, further comprising extending the lateral portion of said gate into said thickness of said buried insulator layer.

11. The method of claim 7, further comprising a step of epitaxy so as to form a part of said ground plane extending in said thickness of said buried insulator layer below said lateral portion of said gate.

* * * * *